United States Patent [19]

Moral et al.

[11] Patent Number: 5,394,305
[45] Date of Patent: Feb. 28, 1995

[54] CARD CAGES FOR ELECTRONIC MODULES

[75] Inventors: Leonardo D. Moral, Chicago; Horace C. Rodriguez, Schaumburg; Ronald M. Samson, Carol Stream; Walter T. Harwood, Streamwood, all of Ill.

[73] Assignee: Charles Industries, Ltd., Rolling Meadows, Ill.

[21] Appl. No.: 173,565

[22] Filed: Dec. 23, 1993

[51] Int. Cl.⁶ .............................................. H05K 7/14
[52] U.S. Cl. ................................... 361/776; 361/752; 361/759; 211/41
[58] Field of Search ............... 361/747, 752, 756, 796, 361/802, 798, 801; 174/17 R, 260; 211/41, 46; 439/65

[56] References Cited

U.S. PATENT DOCUMENTS

| | | | |
|---|---|---|---|
| 313,013 | 12/1990 | Krietzman | D14/100 |
| 3,001,102 | 9/1961 | Stiefel et al. | 317/99 |
| 3,258,650 | 6/1966 | Fiege | 317/101 |
| 3,271,626 | 9/1966 | Howrilka | 317/101 |
| 3,280,377 | 10/1966 | Harris et al. | 317/100 |
| 3,311,792 | 3/1967 | Scoville | 317/101 |
| 3,316,460 | 4/1967 | Scoville | 317/101 |
| 3,377,515 | 4/1968 | Erb | 317/101 |
| 4,227,238 | 10/1980 | Saito | 361/415 |
| 4,277,120 | 7/1981 | Drake et al. | 312/320 |
| 4,327,835 | 5/1982 | Leger | 211/41 |
| 4,558,398 | 12/1985 | Drake | 361/415 |
| 4,672,510 | 6/1987 | Castner | 361/415 |
| 4,984,133 | 1/1991 | Casanova et al. | 361/415 |
| 5,128,833 | 7/1992 | Lin et al. | 361/415 |
| 5,218,519 | 6/1993 | Welch et al. | 361/415 |

*Primary Examiner*—Leo P. Picard
*Assistant Examiner*—Young Whang
*Attorney, Agent, or Firm*—Leydig, Voit & Mayer, Ltd.

[57] ABSTRACT

Card cages for mounting an array of electronic modules are provided for. The card cage comprises a plurality of generally rectangular shaped panels, including a top panel, a bottom panel, a back panel, and two side panels. The panels are adapted for assembly into a generally right-rectangular prism shaped frame having a closed back and an open front and defining one or more module mounting areas. The card cage also comprises guides adapted to slidably receive one or more electronic modules having electrical connectors. The guides are provided on at least one panel defining each mounting area. The back panel has electrical connectors adapted to engage the electrical connectors of the electronic modules. The top, bottom, and side panels are interlockable. Those interlockable panels are fabricated from a single sheet of metal and have a plurality of integral interlocking members. The interlocking members collectively constitute a plurality of associated pairs of tongues and openings. The openings are adapted to interlock with their associated tongues. The interlocked members are interlocked by translating the interlockable panels in a first direction relative to each other such that the tongues are inserted through their associated openings and by subsequently translating the interlockable panels in a second direction relative to each other such that the tongues and openings cooperate to preclude translation of the interlockable panels in the first relative direction. The interlocking members thereby support the interlockable panels relative to each other.

15 Claims, 6 Drawing Sheets

CARD CAGES FOR ELECTRONIC MODULES

FIELD OF THE INVENTION

This invention relates to card cages for electronic modules and methods for their assembly, and especially, to card cages which can be assembled from interlocking panels.

BACKGROUND OF THE INVENTION

Modern communication systems often are assembled by interconnecting various arrays of electronic modules. Such electronic modules, commonly referred to as "cards", may be mounted in a housing, or they may be more or less open circuit boards. The modules commonly are loaded into racks, or "card cages", which facilitate the mounting and connection of the electronic modules.

Typically, card cages incorporate prefabricated panels which are assembled into a generally right-rectangular prism shaped frame having an open front. The back panel has electrical connectors, and the top and bottom panels have appropriately configured guides for receiving modules. In this manner, electronic modules can be slid into the cage and plugged into the back panel. The back panel may include a printed circuit board or various cable connections which facilitate interconnection of the electronic modules into a system.

The panels from which card cages are assembled are fabricated most commonly from sheet metal, and for certain applications, from aluminum, cold rolled steel, and stainless steel. The metal is punched and bent into the desired configuration. Thereafter, the panels are assembled and secured together by fasteners such as metal screws, nuts and bolts, rivets, and spot welding. Card cages which are assembled in this manner are sturdy, and the panels contact each other intimately so that the entire card cage may be grounded by a single connection anywhere on the cage.

Assembling such card cages, however, is relatively time consuming. A given fastening operation, for example, forming a rivet or weld, may not take very long when viewed in isolation; but there may be a great number of such connections which must be made. Especially if the modules emit high frequency electromagnetic radiation, a large number of connections are needed to block leakage of radiation through the seams of the card cage. For example, a thirty module card cage which is approximately 5"×11"×21" might require some thirty or more screws, rivets, spot welds or other fasteners to assemble the panels. Although there may be advantages in using one type of fastener as compared to another, the shear number of fasteners needed makes assembly of the card cage relatively slow whatever connector is used.

Sheet metal is usually the material of choice for card cages because of its cost advantage over other suitable metals, but sheet metal is relatively susceptible to corrosion. Corrosion is a particular concern when a card cage will be installed in environments which are not climate controlled. Moreover, corrosion can be exacerbated by galvanic reactions between the sheet metal of which the panels are composed and the fasteners which hold the panels together since the fasteners usually are made of dissimilar metals. Coatings typically are applied to protect the sheet metal from corrosion, but the integrity of a protective coating, if applied to the panels prior to assembly, may be damaged as fasteners are installed or formed. The fastener itself also may be relatively susceptible to corrosion. On the other hand, if a protective coating is applied after the panels are assembled, it may be difficult to coat all surfaces of the panels.

It also will be appreciated that shipping of card cages is made more costly because of their relatively large bulk in comparison to their weight. Thus, it may be desirable for some applications to ship panels in an unassembled state for assembly at a local distribution center or at the site where the card cage will be installed and used. Such "off-site" assembly of conventional card cages, however, is made more difficult or impractical because of the need for specialized equipment, such as riveters or welders, or simply because of the difficulty of forming in an relatively unsystemized setting the large number of fasteners needed in conventional card cages.

An object of the subject invention, therefore, is to provide a card cage which is sturdy, which can be easily grounded, and which otherwise meets the functional requirements for card cages, but which also is more easily and efficiently assembled. A related and more specific object is to provide such a card cage which is assembled with a reduced number of fasteners.

Another object of the subject invention is to provide such card cages which may be assembled in a manner which minimizes the likelihood of corrosion, and, in particular, is more compatible with the use of protective coatings for sheet metal.

Yet another object is to provide a card cage which may be shipped unassembled and is more susceptible to off-site assembly.

A further object of the subject invention is to provide such card cages wherein all of the above advantages are realized.

Those and other objects and advantages of the invention will be apparent to those skilled in the art upon reading the following detailed description and upon reference to the drawings.

SUMMARY OF THE INVENTION

The subject invention provides for card cages for mounting an array of electronic modules. The card cage comprises a plurality of generally rectangular shaped panels, including a top panel, a bottom panel, a back panel, and two side panels. The panels are adapted for assembly into a generally right-rectangular prism shaped frame having a closed back and an open front and defining one or more module mounting areas. The card cage also comprises guides adapted to slidably receive one or more electronic modules having electrical connectors. The guides are provided on at least one panel defining each mounting area. The back panel has electrical connectors adapted to engage the electrical connectors of the electronic modules.

The top, bottom, and side panels are interlockable. Those interlockable panels are fabricated from a single sheet of metal and have a plurality of integral interlocking members. The interlocking members collectively constitute a plurality of associated pairs of tongues and openings. The openings are adapted to interlock with their associated tongues.

The interlocked members are interlocked by translating the interlockable panels in a first direction relative to each other such that the tongues are inserted through their associated openings and by subsequently translating the interlockable panels in a second direction relative to each other such that the tongues and openings cooperate to preclude translation of the interlockable panels in the first relative direction. The interlocking members thereby support the interlockable panels relative to each other.

As described in greater detail below, to the extent that interlocking members are used, assembly of the panels into a card cage is facilitate and economized. The interlocking members can be formed with little added effort or expense as a sheet of metal is worked to form a panel. Thereafter, manipulation of the panels into an interlocked assembly is more quickly and easily accomplished than would be the fastening operations obviated by the interlocking members.

DETAILED DESCRIPTION OF THE INVENTION

Figure 1:
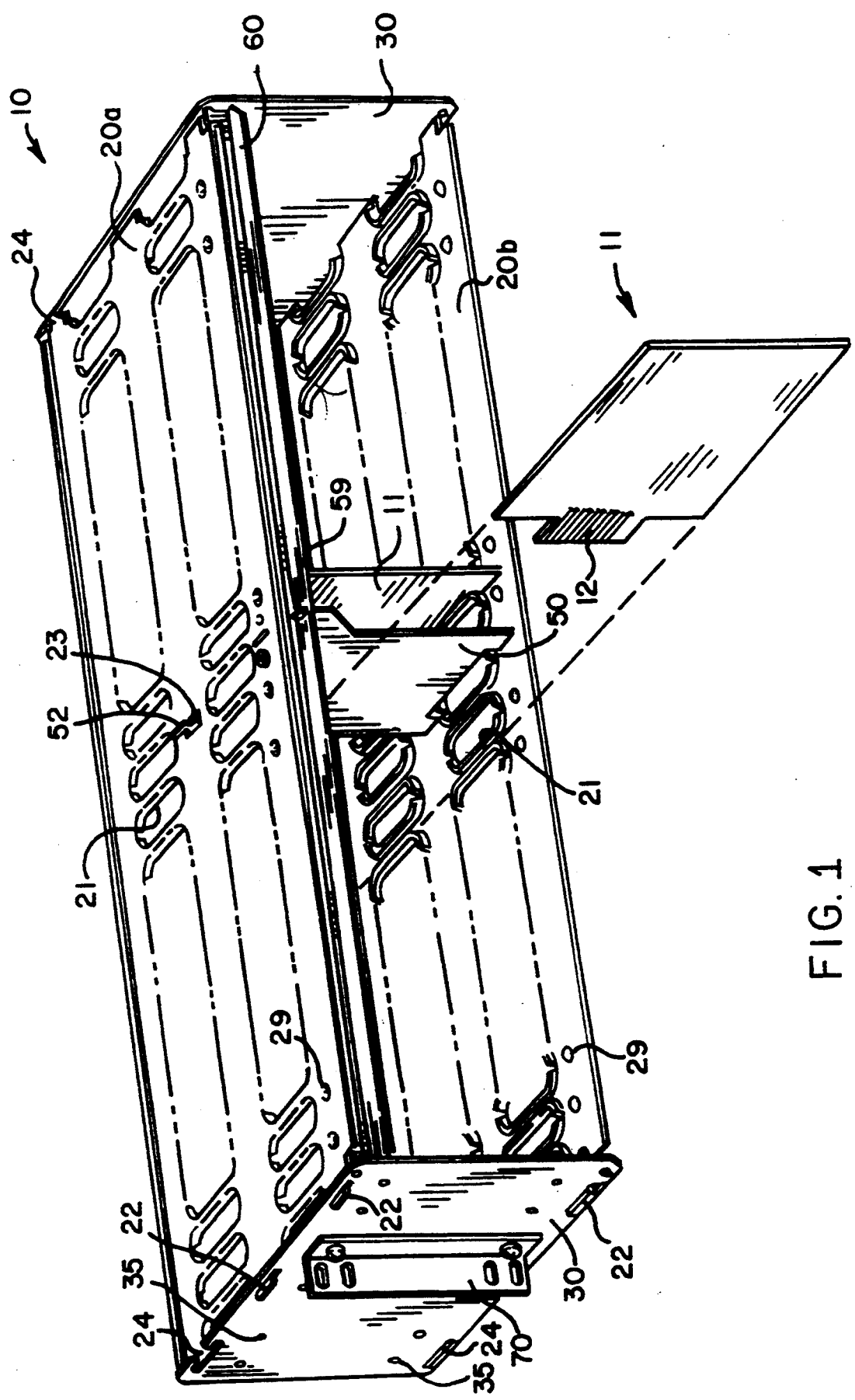
FIG. 1 is a perspective view of a first preferred embodiment of the card cages of the subject invention showing an assembled card cage 10 and the manner in which electronic modules may be mounted therein.

FIG. 1 illustrates a first preferred embodiment 10 of the card cages of the subject invention. As shown therein, the card cage 10 is a generally right-rectangular prism shaped frame having a closed back and an open front. The card cage 10 comprises a top panel 20a, a bottom panel 20b, two side panels 30 and a back panel 40. The card cage 10 also preferably includes a centrally disposed divider panel, such as panel 50. In accordance with the subject invention, the card cage 10 is adapted to mount an array of electronic modules. More specifically, the panels 20, 30, 40, 50 define two module mounting areas, a left area and a right area, each of which can accommodate a number of modules. Electronic modules 11 having electrical connectors 12 are illustrated schematically in FIG. 1.

More specifically, the card cages of the subject invention are provided with guides which are adapted to slidably receive one or more electronic modules. The guides are provided on at least one of the panels which define each module mounting area. The back panel of the card cage has electrical connectors adapted to engage the electrical connectors of the electronic modules. It will be appreciated, therefore, that interconnection of the electronic modules into a system is facilitated thereby.

In the card cage 10, electronic modules are slidably received in guides 21. The guides 21 are integrally formed in the top panel 20a and bottom panel 20b. For the sake of clarity not all of the guides 21 are shown in FIGS. 1 and 2, but it will be appreciated that the illustrated guides extend across the width of the panels 20 in the manner generally indicated therein and are of identical design.

The guides 21 are preferred because they may be formed relatively easily by punching and bending the sheet of metal from which the panels are fabricated, as will be discussed in detail below. At the same time, cut-outs are provided between the guides to allow efficient circulation of air about modules mounted in the card cage. Dimples 29 are provided to prevent users from attempting to improperly insert modules. It will be appreciated, however, that any guides suitable for mounting electronic modules in card cages may be used, for example, the guides incorporated into the third preferred embodiment discussed below. Other designs and layouts for guides are known, and the choice of a particular guide design and their location on the panels will be dictated in large part by the type of modules to be mounted in the card cage.

Figure 2:
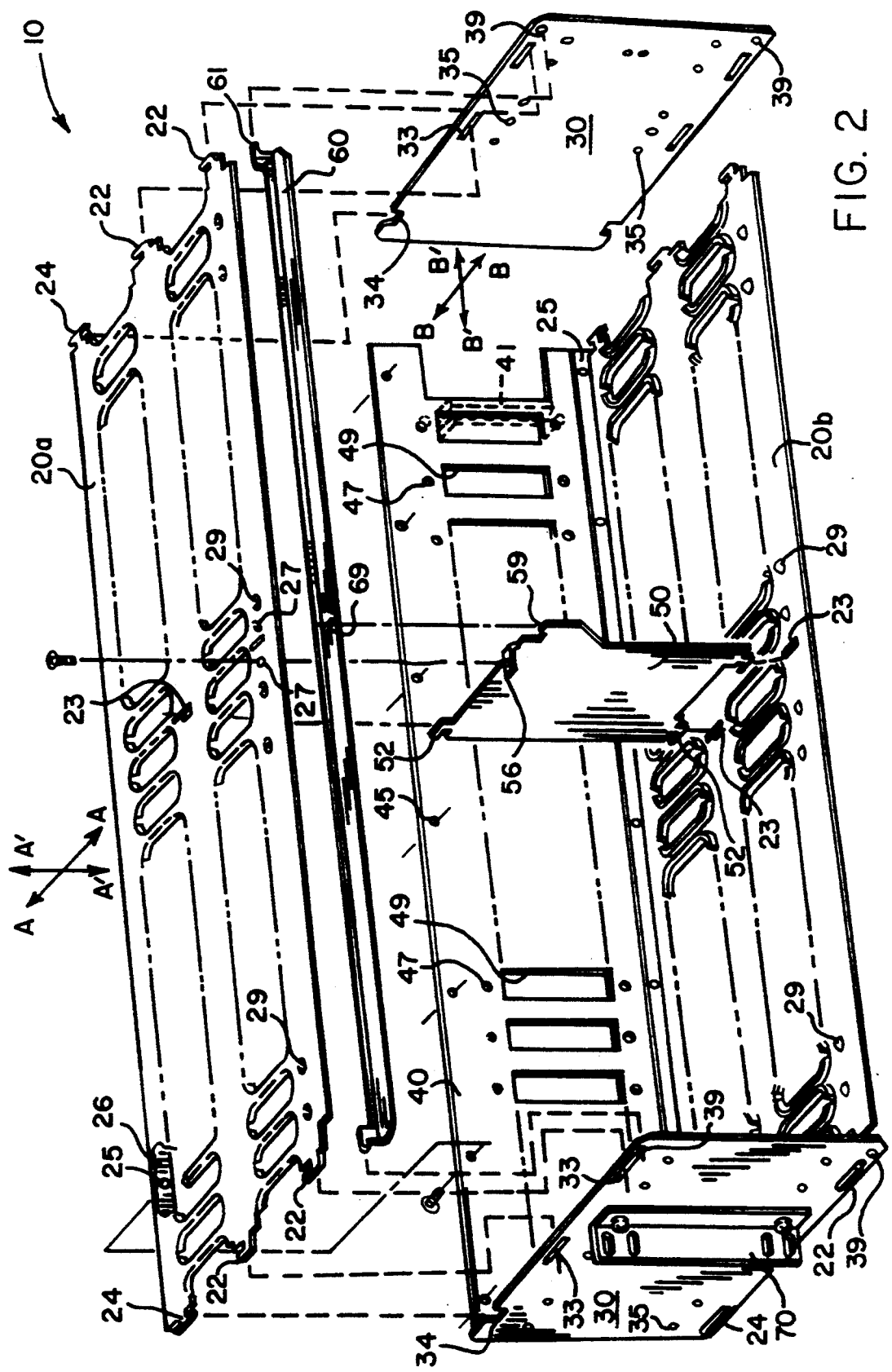
FIG. 2 is a partially exploded perspective view of the card cage 10 shown in FIG. 1, showing details of interlocking members and the manner in which the card cage is assembled.

In the card cage 10, as shown in FIG. 2, the back panel 40 is fabricated from a metal sheet having a series of generally rectangular openings 49 (not all of which are illustrated) which are adapted to receive electrical connectors 41 (shown schematically in phantom). The connectors 41 are secured to the back panel 40 by, for example, screws which may be inserted through screw openings 47. The connectors 12 of the modules 11 and the connectors 41 of the back panel 40 are compatible with each other to establish an electrical connection therebetween, preferably by simply plugging the module 11 into the connector 41. The back panel, however, may be a printed circuit board, with or without logic components, having suitable connectors.

The card cages may be provided with means for ensuring that the modules, once installed, remain securely plugged in. For example, the card cage 10 is provided with a lock bar 60 which is pivotally mounted across the open front of the card cage 10 by pins 61 which extend through suitable openings 39 in the side walls 30. The lock bar 60 may be pivoted upwardly to allow electronic modules to be plugged into the card cage 10. Thereafter, the lock bar 60 may be pivoted downwardly and flexed slightly so that opening 69 in the lock bar 60 engages a post 59 on the divider panel 50. The lock bar 60, when held in its downward position as shown in FIG. 1, prevents modules from becoming inadvertently unplugged.

A mounting ear 70 is screwed on each side panel 30 and multiple sets of screw holes 35 are provided in the side panels 30 so that the location of the mounting ears 70 may be varied as desired. The mounting ears 70 facilitate the mounting of the card cage to a suitable support, for example, conventional racks designed to accommodate a plurality of card cages. While it is preferable to secure in some manner the card cage when it is installed for use, the manner in which that is done forms no part of the subject invention. The mounting ears, or other suitable mounting means, are a matter of preference or expediency.

It also will be appreciated that the particular configuration of the guides and connectors, the choice between connectors mounted on a metal back panel or on a circuit board, and the overall dimensions and configuration of the card cages of the subject invention will be dictated in large part by the type and number of electronic modules which will be mounted therein as well as the type of system which will be constructed. The card cages of the subject invention, however, can be adapted to accommodate a wide variety of electronic modules from which many different electronic systems may be built.

In accordance with the subject invention, the top panel 20a, bottom panel 20b, and side panels 30 are each fabricated from a single sheet of metal. The grade, thickness, and type of metal may be varied to meet structural strength, conductivity, corrosion resistance, and cost considerations, among other conventional criteria, but typically the panels 20, 30 will be fabricated from sheet metal, and less commonly from aluminum, cold rolled steel, or stainless steel. The thickness of the panels may be varied as desired. It has been found that thicknesses of 60 to 74 mils can be machined easily and produces a card cage of good mechanical characteristics. Because it is softer, the thickness of aluminum panels may be somewhat greater, for example, up to 90 mil. The metal sheet may be formed into panels with the various features described herein by conventional techniques, such as stamping, punching and bending, by conventional metal working equipment.

In accordance with a highly preferred feature of the subject invention, the panels 20a and 20b (referred to collectively as 20) are of identical construction, as are the side panels 30. Each panel 20, 30 may have a unique configuration, if desired, but it will be appreciated that inventory costs are reduced and assembly simplified to the extent that the panels are the same and are interchangeable as described herein.

The top, bottom, and side panels of the card cages of the subject invention are interlockable via a plurality of interlocking members provided thereon. The interlocking members are integral with their respective panels, that is, they are a part of the interlockable panel and formed in or from the same sheet of metal from which the interlockable panel itself was fabricated. The interlocking members collectively constitute a plurality of associate pairs of tongues and openings. Each associated pair of interlocking members includes a tongue which is provided on one panel and an opening provided on a panel which is adjacent to the first panel in the assembled card cage. The openings are adapted to interlock with their respective tongues.

In the preferred embodiment 10, each panel 20 is provided with four L-shaped tongues 22 which project from and in a relationship coplanar to the ends of the panel 20. Each panel 30 is provided with four rectangular shaped openings 33 situated near the top and bottom edges of the panels 30.

The interlockable top, bottom, and side panels, in accordance with the subject invention, are assembled by interlocking the interlocking members. More particularly, the interlocking members are interlocked by translating, in a first direction relative to each other, adjacent interlockable panels on which associated pairs of interlocking members are provided, for example, the top and a side panel. In this manner, the tongues are inserted through their associated openings. Thereafter, the interlockable panels are translated in a second direction relative to each other so that the interlocking members cooperate to preclude translation of the interlockable panels in the first relative direction. It will be appreciated that when the top, bottom, and side panels are so assembled, that the interlocking members tend to support those panels relative to each other.

For example, in the preferred embodiment 10, the top panel 20a is first translated in a direction perpendicular to a side panel 30 so that the tongues 22 on one end of the panel 20a are inserted through the openings 33 near the top of the side panel 30. The top panel 20a then is translated in a direction parallel to the side panel 30. After this second translation the L-shaped tongues 22 no longer can be withdrawn from the openings 33. The bottom panel 20b and the other side panel 30 are assembled thereto in a similar manner.

When a large number of electronic modules will be mounted in a single card cage, the card cage necessarily will be larger and it may be desirable to provide the card cage with a divider panel. The divider panel tends to reinforce the main frame defined by the top, bottom, side, and back panels. It also may be desirable to incorporate a divider to clearly separate areas designed to accommodate different types of modules.

For example, card cage 10 includes a divider panel 50 which, in the assembled card cage 10, extends between the top and bottom panels 20. The divider panel 50 has three L-shaped tongues 52 which interlock with openings 23 in the panels 20. The interlocking of the divider panel 50 to the panels 20 is performed by translating the panels in first and second relative directions in a manner analogous to interlocking of the top, bottom, and side panels.

Preferably, some or all of the interlockable panels, once assembled, are immobilized. That is, means are provided for resisting translation of the interlockable panels in the second relative direction once the interlocking members have been interlocked as described above. This reduces the likelihood that the panels will be unintentionally disassembled as they are installed or otherwise handled.

In the preferred embodiment 10, each panel 20 has a T-shaped tongue 24 on each end of the panel 20. The tongues 24 are adapted to slip into and around rectangular cut-outs 34 on the side panels 30. Once the T-shaped tongues 24 and cut-outs 34 are so engaged, the top/bottom panels 20 cannot be translated in a reverse parallel direction relative to the side panels 30, thereby preventing "unlocking" of the interlocked interlocking members 22, 33 and disassembly of the panels 20, 30. It will be appreciated, of course, that to accomplish the interlocking of the top 20a, bottom 20b, and side 30 panels as described above, or to disassemble those panels, the top/bottom panels 20 are flexed slightly out of their normal planar configuration so that the T-shaped tongues 24 clear the edges of the side panels 30. This flexing of the panels 20 allows insertion of the L-shaped tongues into the openings 33 to begin interlocking of the panels 20, 30. Likewise, the flexing of the panels 20 allows the panels 20 to be translated in a reverse parallel direction relative to the side panels 30 to begin disassembly of the panels 20, 30.

The divider panel 50 is immobilized relative to top panel 20a by a screw which extends through an opening 27 in the top panel 20a and a flange 56 extending at a right angle from reinforcing panel 50 and which may be secured by a suitable nut. Welds, rivets, or other fasteners may be used to immobilize the divider panel 50 vis a vis the panels 20. Likewise, the panels 20 and 30 may be immobilized relative to each other by any suitable fastener, stop or the like.

The back panel is assembled to the top, bottom, and/or side panels by any suitable means in order to complete assembly of the card cage. For example, in the card cage 10, the back panel 40 is secured to the top and bottom panels 20 by screws which pass through openings 45 in the back panel 40 and openings 25 in flanges 26 of panels 20. Other types of fasteners, such as rivets and spot welds, however, may be used.

It will be appreciated, therefore, that the card cages of the subject invention meet all the conventional requirements for card cages. The interlocking members provide a strong and reliable connection between panels and mutual support therebetween. The interlocking members are in intimate contact, thereby assuring that panels so assembled may be grounded by a common ground. At the same time, however, assembly of the card cages in large part is accomplished simply by manipulating the panels. Even if not completely eliminated, the number of fasteners in a card cage is greatly reduced by providing interlockable panels, and the manipulation of interlockable panels may be accomplished in less time than it would take to provide the fasteners which have been eliminated. This time saving not only offers advantages in mass production of card cages, but also makes off-site assembly much more feasible.

Moreover, the use of interlocking members is more compatible with protective coatings which commonly are applied to sheet metal. The coating can be applied after the panel is formed, but before assembly of the card cage, so that it is easier to coat all surfaces of the panel, including the interlocking members themselves. Compared, for example, to rivets and spot welds which may be susceptible to corrosion or damage the protective coating as they are formed, the use of interlocking members facilitates and enhances the use of protective coatings for sheet metal card cages.

Preferably, the interlocking members, screw holes, and the like needed for assembly of the panels are disposed on or about a plane of symmetry extending through the panel. For example, in the panels 20, tongues 22, 24 and screw holes 25, 27 are disposed about, and openings 23 are disposed on a plane of symmetry defined by lines A, A' shown in FIG. 2. Thus, a panel 20 may be used as a top panel 20a or a bottom panel 20b simply by rotating the panel 180° about line A. Likewise, openings 33, 35 are disposed about a plane of symmetry defined by lines B, B' so that panels 30 may be incorporated on either side of the cage in their illustrated orientation or when rotated 180° about line B. It will be appreciated that by providing a common design for panels, especially with the described symmetry, that inventory and tooling costs are further reduced. There are fewer unique panels in a card cage and assembly is further facilitated because a panel may be assembled into a card cage in multiple positions and orientations.

Figure 3:
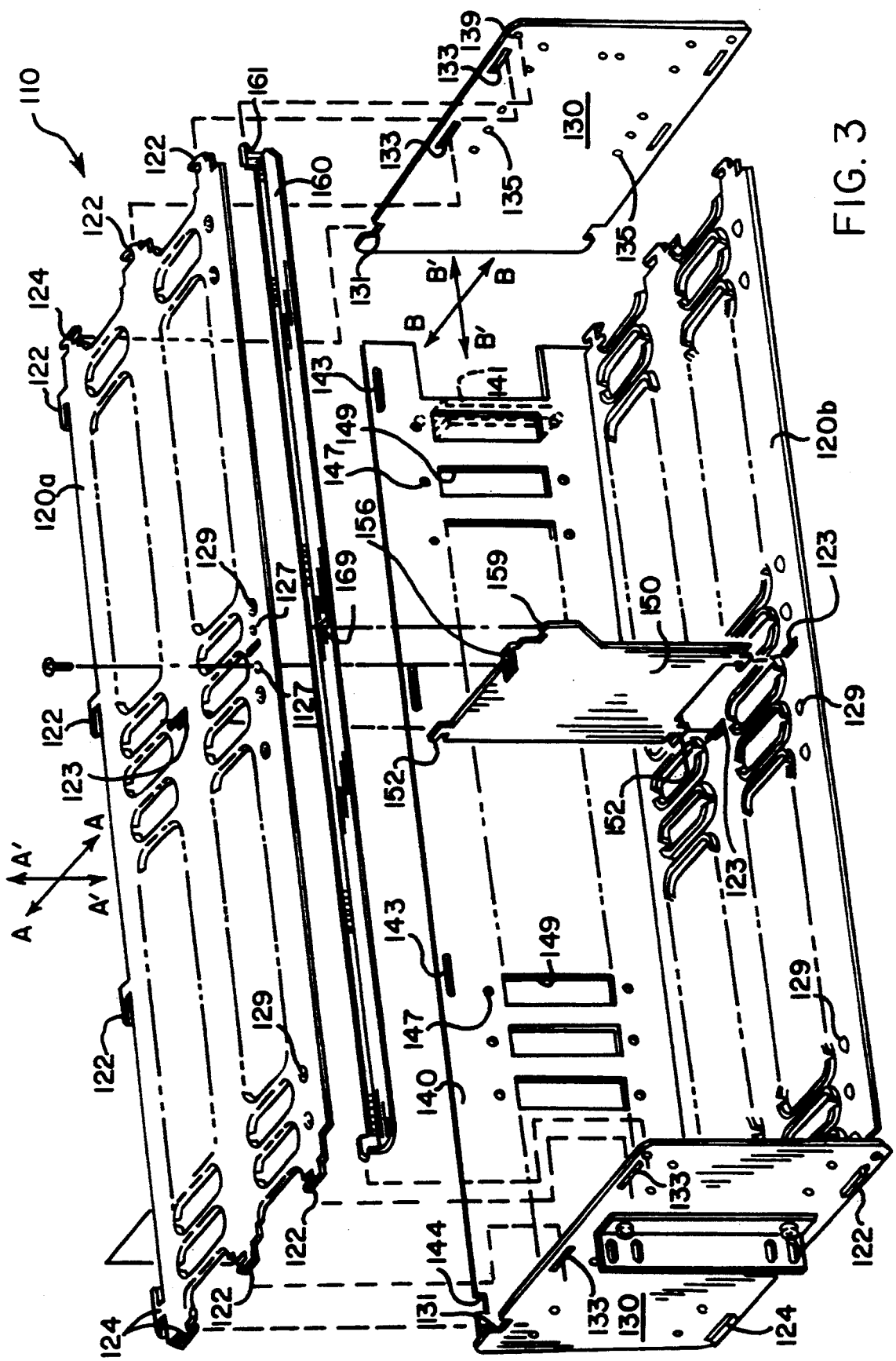
FIG. 3 is a partially exploded perspective view, similar to the view of FIG. 2, showing a second preferred embodiment 110 of the card cages of the subject invention.
Figure 4:
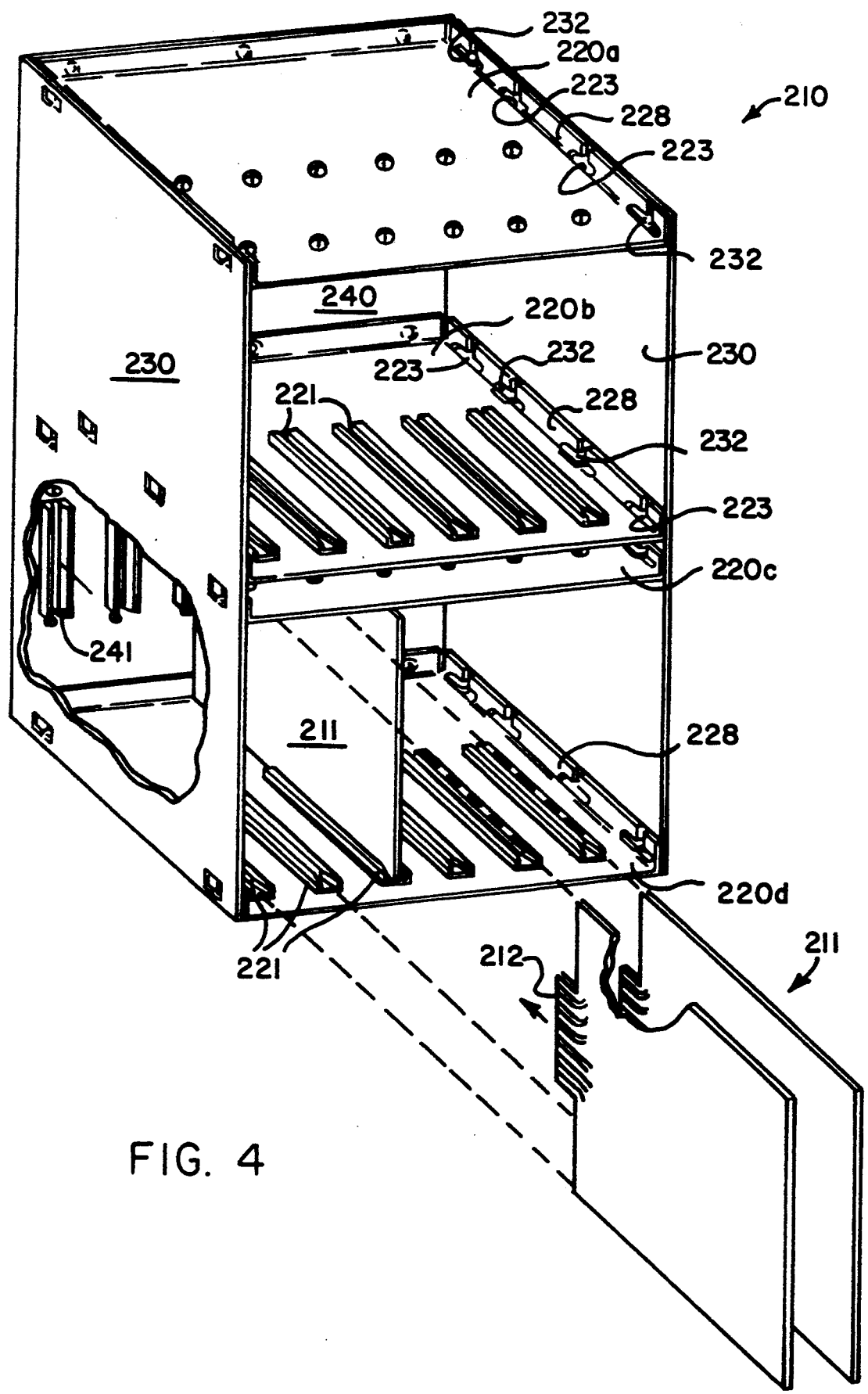
FIG. 4 is a perspective view, similar to the view of FIG. 1, showing a third preferred embodiment 210 of the card cages of the subject invention.
Figure 5:
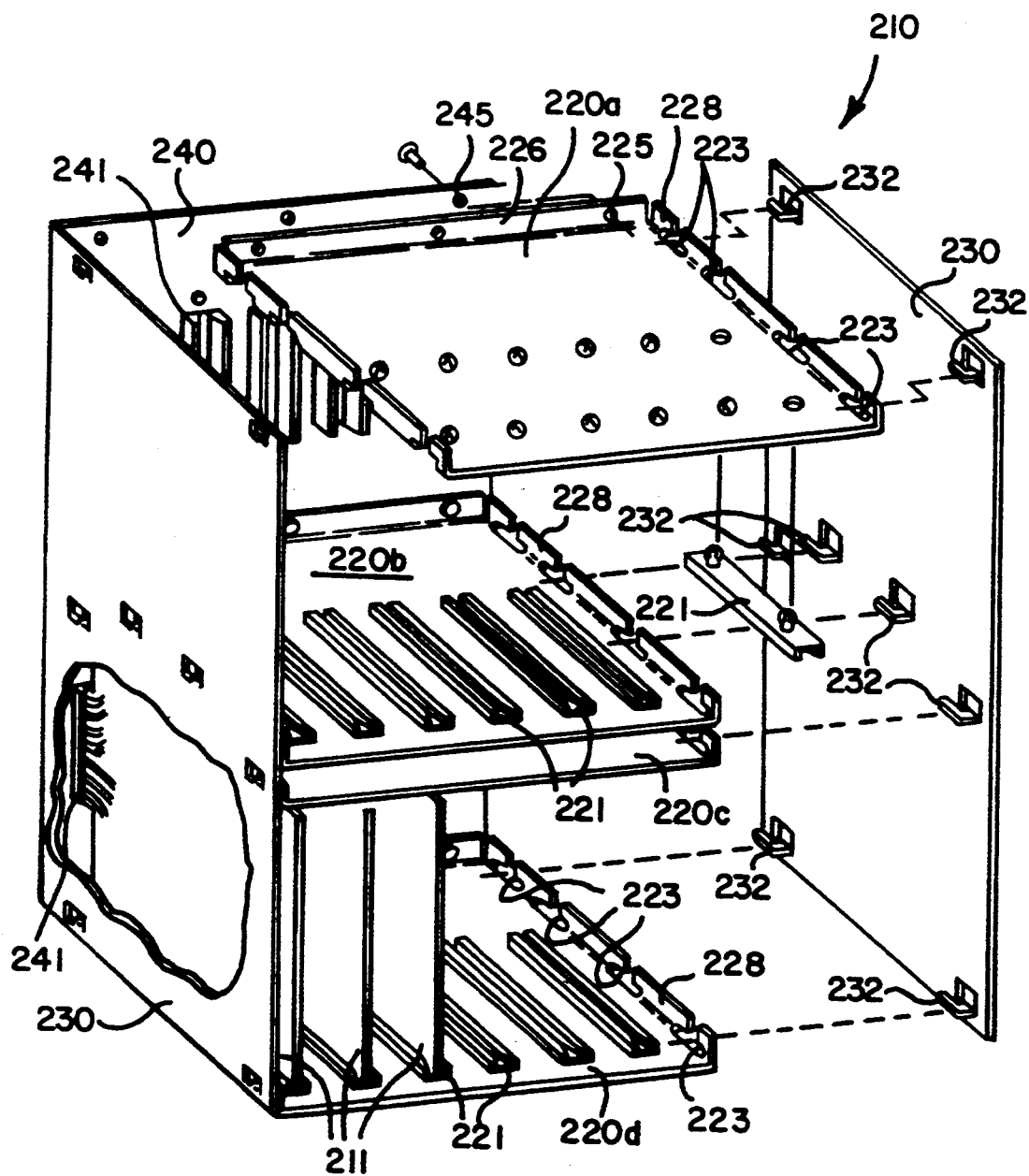
FIG. 5 is a partially exploded perspective view, similar to the views of FIGS. 2 and 4, showing the card cage 210 of FIG. 4.
Figure 6:
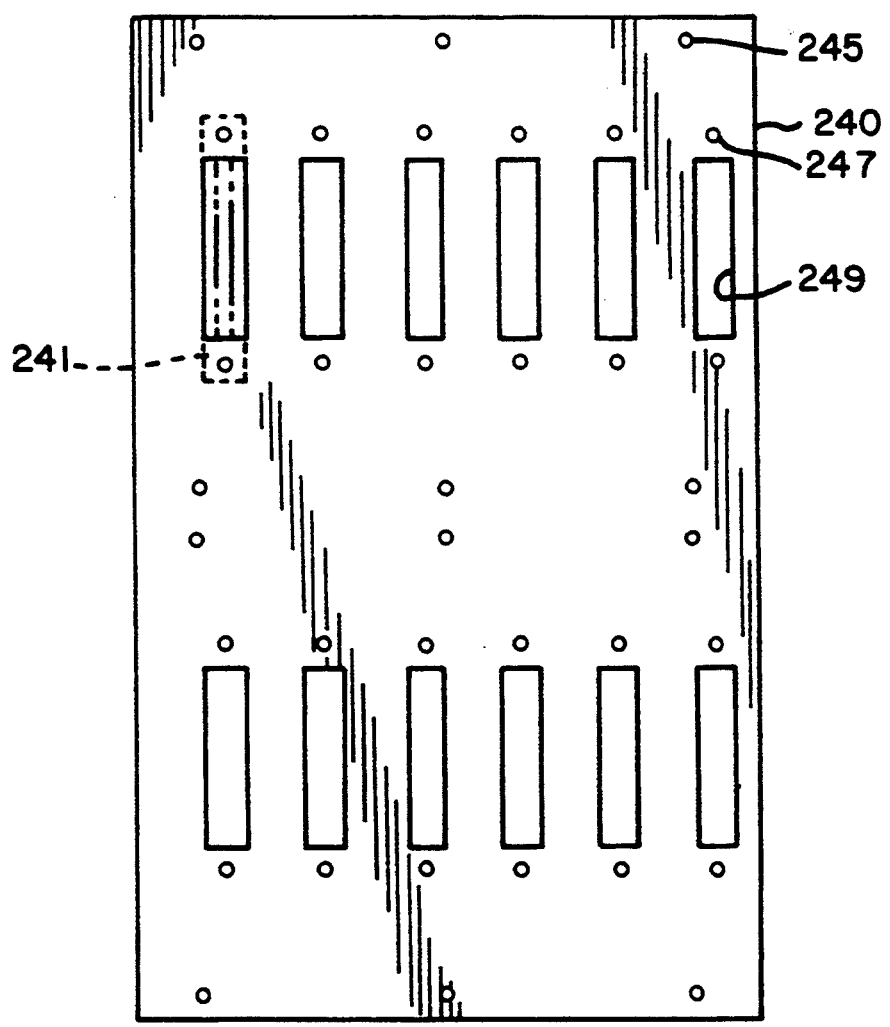
FIG. 6 is a plan view of the back panel of the card cage 210 shown in FIG. 4.

Assembly of the card cages of the subject invention can be further economized if the back panel is assembled by interlocking it with one or more of the top, bottom, and side panels. For example, in a second preferred embodiment 110, illustrated in FIG. 3, the back panel is interlocked to the top and bottom panels.

The card cage 110 in most respects is identical to the card cage 10, common or analogous features thereof being referenced by similar reference numbers. For example, the top panel in card cage 110 is referenced as 120a, the bottom panel as 120b, the side panel as 130, the back panel 140, and so on.

The back panel 140 of the card cage 110, however, is interlocked to the top and bottom panels 120. More specifically, the top and bottom panels 120 each are provided with three additional L-shaped tongues 122 on their back edge. Those tongues 122 interlock with openings 143 on the top and bottom edges of the back panel 140. The back panel 140 is immobilized by engaging in additional T-shaped tongue 124 located on the back edge of both panels 120 with cut-outs 144 on the back panel 140.

It will be appreciated, however, that the interlocking members may have other configurations which enable the panels to be interlocked by translating the panels in a first and second relative direction as described above, and such configurations are within the scope of the subject invention. For example, the interlocking members may have a configuration as those incorporated into a third preferred embodiment 210 shown in FIGS. 4–7.

The card cage 210 in may respects is similar to card cages 10, 110. In the card cage 210, however, the side panels 230 have L-shaped tongues 232 which project perpendicular therefrom. The top panel 220a and bottom panel 220b are of identical construction and have a plurality of openings 223 which are disposed in side flanges 228.

Card cage 210 has two divider panels 220c and 220d. The divider panels 220c, 220d are of identical construction to the top panel 220a and bottom panel 220b. All panels 220 are provided with injection molded, plastic guides 221 which are snap mounted through appropriate holes in the panels 220. The panels 220 are interlocked to the side panels 230 as described above in reference to card cage 10. It will be appreciated that each panel 220 is provided with "extra" openings 223, i.e., openings which are not interlocked with tongues in an assembled card cage but which enable the panel to be assembled in any of the top, bottom, or divider positions. The back panel 240 may be screwed to the panels 220 through suitable openings 225 on a back flange 226 of the panels 220, as illustrated, or otherwise assembled to the other panels by other types of fasteners or by interlocking members as desired.

Figures 7, 8:
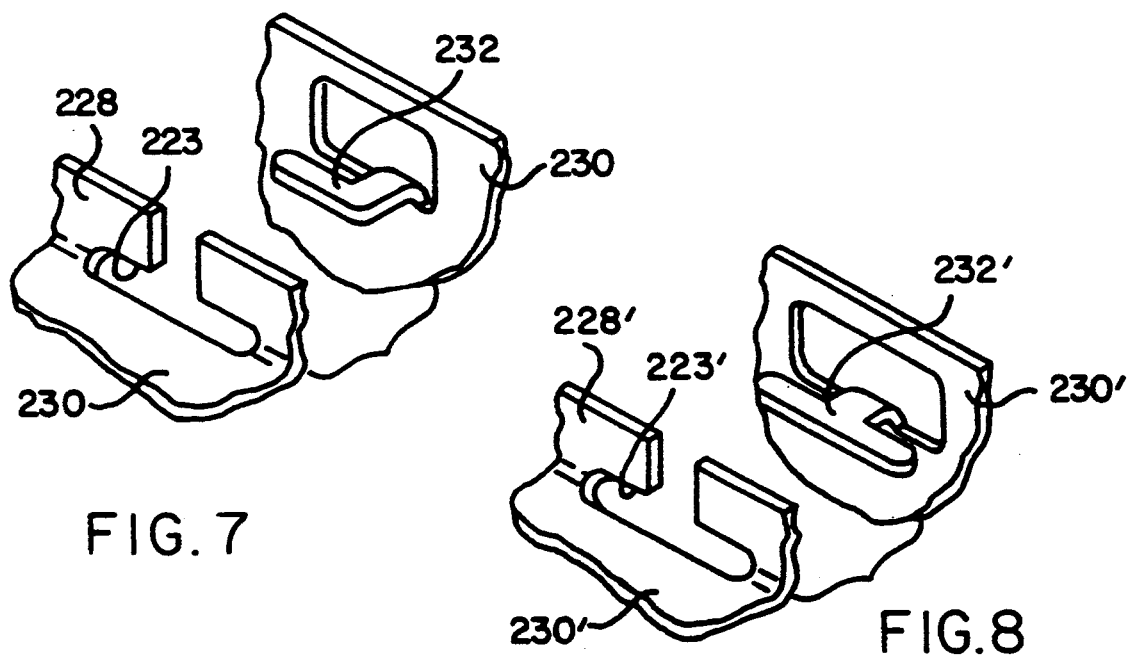
FIG. 7 is a perspective view of interlocking members of the card cage 210 shown in FIG. 4.
FIG. 8 is a perspective view of alternate interlocking members which may be used, for example, in card cage 210 shown in FIG. 4.

As a further example of possible variations of the subject invention, the L-shaped tongues 232 in card cage 210 may be T-shaped, such as the T-shaped tongues 232' shown in FIG. 8. The T-shaped tongues 232' interlock with openings 223 in a manner similar to the L-shaped tongues 232 except that the second translation required to interlock the tongues 232' may be accomplished in either of two opposite directions.

As noted above, this invention has been disclosed and discussed primarily in terms of specific embodiments thereof. But it is not intended to be limited thereto. Other modifications and embodiments will be apparent to the worker in the art.

We claim as our invention:

1. A card cage for mounting an array of electronic modules, the card cage comprising:
    a plurality of generally rectangular shaped panels assembled into a generally right rectangular prism shaped frame having a closed back and an open front and defining at least one mounting areas;
    the panels including a top panel, a bottom panel, a back panel, and two side panels, the top, bottom, and side panels being interlocked and each being fabricated from a single sheet of metal; and guides adapted to slidably receive at least one electronic modules having electrical connectors, the guides being provided on at least one panel defining each mounting area;

the back panel having electrical connectors adapted to engage the electrical connectors of the electronic modules;

the interlocked panels having a plurality of integral interlocking members;

the interlocking members collectively constituting a plurality of associated pairs of tongues and openings, the openings being interlocked with their associated tongues; and the interlocking members being interlocked by translating the interlocked panels in a first direction relative to each other such that the tongues are inserted through their associated openings and by subsequently translating the interlocked panels in a second direction relative to each other such that the tongues and openings cooperate to preclude translation of the interlocked panels in the first relative direction, the interlocking members thereby supporting the panels relative to each other.

2. The card cage of claim 1, wherein the back panel is interlocked.

3. The card cage of claim 1, wherein the back panel is assembled to the interlocked panels by a plurality of fasteners.

4. The card cage of claim 1, wherein the tongues project in a relationship coplanar to their associated panels.

5. The card cage of claim 1, wherein the tongues project perpendicularly from their associated panels and the openings are disposed in a flange extending perpendicularly from their associated panels.

6. The card cage of claim 1, wherein guides are provided on both the bottom panel and the top panel.

7. The card cage of claim 6, wherein the divider panel is disposed between the top panel and the bottom panel parallel thereto.

8. The card cage of claim 1, wherein the panels include at least one divider panel and define at least two card mounting areas.

9. The card cage of claim 8, wherein the divider panel is interlocked.

10. The card cage of claim 7, wherein the top, bottom, and divider panels are interchangeable.

11. The card cage of claim 1, including interlocked panels immobilized by at least one fasteners.

12. The card cage of claim 1, wherein the side panels are interchangeable.

13. The card cage of claim 1, wherein the top and bottom panels are interchangeable.

14. A method of fabricating a card cage for mounting electronic modules, the method comprising:

providing a plurality of generally rectangular shaped panels including a top panel, a bottom panel, a back panel, and two side panels, the top panel, bottom panel, and side panels each being fabricated from a single sheet of metal, being interlockable, and having a plurality of integral interlocking members, the interlocking members collectively constituting a plurality of associated pairs of tongues and openings, the openings being adapted to interlock with their associated tongues; and assembling the panels into a generally right-rectangular prism shaped frame having a closed back and an open front, the interlockable panels being assembled by interlocking the interlocking members, the interlocking members being interlocked by translating the interlockable panels in a first direction relative to each other such that the tongues are inserted through their associated openings and by subsequently translating the interlockable panels in a second direction relative to each other such that the tongues and openings cooperate to preclude translation of the panels in the first relative direction, the interlocking members thereby supporting the interlocking panels relative to each other.

15. The method of claim 14, wherein the back panel is interlockable.

* * * * *

UNITED STATES PATENT AND TRADEMARK OFFICE
CERTIFICATE OF CORRECTION

PATENT NO. : 5,394,305

DATED : FEBRUARY 28, 1995

INVENTOR(S) : LEONARDO D. MORAL, HORACE C. RODRIGUEZ, RONALD M. SAMSON AND WALTER T. HARWOOD

It is certified that error appears in the above-identified patent and that said Letters Patent is hereby corrected as shown below:

Column 4, line 5, delete "2Ob" and substitute therefor -- 20b --; and

Column 6, line 13, delete "2Ob" and substitute therefor -- 20b --.

IN THE CLAIMS:

Column 9, line 28, after "thereby supporting the" insert -- interlocked --.

Signed and Sealed this

Sixteenth Day of May, 1995

Attest:

BRUCE LEHMAN

Attesting Officer

Commissioner of Patents and Trademarks